United States Patent [19]
Jang et al.

[11] Patent Number: 5,637,529
[45] Date of Patent: Jun. 10, 1997

[54] METHOD FOR FORMING ELEMENT ISOLATION INSULATING FILM OF SEMICONDUCTOR DEVICE

[75] Inventors: Se A. Jang; Tae S. Song, both of Kyoungki-do, Rep. of Korea

[73] Assignee: Hyundai Electronics Industries Co., Ltd., Kyoungki-do, Rep. of Korea

[21] Appl. No.: 702,062

[22] Filed: Aug. 23, 1996

[30] Foreign Application Priority Data

Aug. 26, 1995 [KR] Rep. of Korea .................. 95-26729

[51] Int. Cl.⁶ ...................................... H01L 21/76
[52] U.S. Cl. ..................... 437/69; 437/72; 437/24; 437/25; 437/26
[58] Field of Search ..................... 437/69, 70, 72, 437/73, 24, 25

[56] References Cited

U.S. PATENT DOCUMENTS

| | | |
|---|---|---|
| 4,728,619 | 3/1988 | Pfiester et al. |
| 4,920,076 | 4/1990 | Holland et al. .................. 437/24 |
| 4,986,879 | 1/1991 | Lee .................................. 437/72 |
| 5,149,669 | 9/1992 | Hosaka ............................ 437/72 |
| 5,266,510 | 11/1993 | Lee . |
| 5,298,451 | 3/1994 | Rao ................................. 437/70 |

Primary Examiner—Trung Dang
Attorney, Agent, or Firm—Reid & Priest LLP

[57] ABSTRACT

A method for forming an element isolation insulating film of semiconductor devices, by which junction leakage current can be greatly reduced, comprising the steps of: forming a pad oxide film and a first insulating film on a semiconductor substrate, in sequence; patterning the pad oxide film and the first insulating film to expose an inactive region of the semiconductor device; constructing a spacer with a second insulating film at the side wall of the patterned first insulating film; etching the semiconductor substrate at a certain depth, to form a trench, the patterned first insulating film and the second insulating film spacer serving as a mask; implanting germanium impurities in the trench at a predetermined dose under a predetermined energy, to form an amorphous region to remove the lattice defective occurring upon forming the trench, the patterned first insulating film and the second insulating film spacer serving as a mask; crystallizing the amorphous region by a solid phase epitaxy process; and constructing an element isolation insulating film in the trench by thermal oxidation.

5 Claims, 2 Drawing Sheets

METHOD FOR FORMING ELEMENT ISOLATION INSULATING FILM OF SEMICONDUCTOR DEVICE

BACKGROUND OF THE INVENTION

1. Field of the Invention

The present invention relates to a method for forming an element isolation insulating film of semiconductor devices in a trench by thermal oxidation. More particularly, the present invention is concerned with greatly improving the yield and productivity of semiconductor devices by reducing lattice defects and thus, junction leakage current.

2. Description of the Prior Art

From the perspective of the high integration of the semiconductor device, it is very important to reduce the dimension of each element and the width and area of the isolation region existing between one element and another indeed, the size of the cell is dependent on such reduction, at which point element isolation techniques are considered as critical techniques that determine the size of the memory cell.

Conventionally, various methods have been used to form element isolation insulating films, including the local oxidation of silicon (LOCOS) technique which is of insulator isolation, the poly buferred LOCOS (PBL) technique which is of the structure in which an oxide film, a polysilicon film and a nitride film are in laminated in sequence on a substrate, and the trench technique by which an insulator is buried in a trench formed in a semiconductor substrate.

As semiconductor devices are highly integrated, troublesome problems including bird's beak, planarization and punchthrough come to arise. To solve such problems, an element isolation insulating film has been formed in a trench created by dry-etching a semiconductor substrate at a certain thickness. However, lattice defectiveness occurs upon etching of the semiconductor substrate. In addition, such lattice defectiveness is enlarged when creating the element isolation insulating film, giving rise to an increase of junction leakage current and thereby lowering the production yield and productivity of semiconductor devices.

SUMMARY OF THE INVENTION

Therefore, it is an objective of the present invention to overcome the above problems encountered in prior arts and to provide a method for forming an element isolation insulating film of semiconductor devices, which can remove the lattice defects, thereby improving the yield and productivity of semiconductor devices.

Based on intensive and thorough research by the present inventors, the above objective can be accomplished by providing a method for forming an element isolation insulating film of semiconductor devices, comprising the steps of: forming a pad oxide film and a first insulating film on a semiconductor substrate, in sequence; patterning the pad oxide film and the first insulating film to expose an inactive region of the semiconductor device; constructing a spacer with a second insulating film at the side wall of the patterned first insulating film; etching the semiconductor substrate at a certain depth, to form a trench, said patterned first insulating film and said second insulating film spacer serving as a mask; implanting germanium impurities in the trench at a predetermined dose under a predetermined energy, to form an amorphous region to remove the lattice defects occurring upon forming the trench, said patterned first insulating film and said second insulating film spacer serving as a mask; crystallizing the amorphous region by a solid phase epitaxy process (hereinafter referred to as "SPE"); and constructing an element isolation insulating film in the trench by thermal oxidation.

Herein, the first and the second insulating films are made of nitride. It is preferred that the impurities are implanted at a dose ranging from $9 \times 10^{13}/cm^2$ to $1.0 \times 10^{15}/cm^2$ under an accelerating energy of 10 to 100 KeV and the SPE process is carried out at a temperature of 500° to 600° C. for 1 to 3 hours under a nitrogen atmosphere.

BRIEF DESCRIPTION OF THE DRAWINGS

Other objects and aspects of the invention will become apparent from the following description of embodiments with reference to the accompanying drawings in which.

DETAILED DESCRIPTION OF THE PREFERRED EMBODIMENT

Figure 1A:
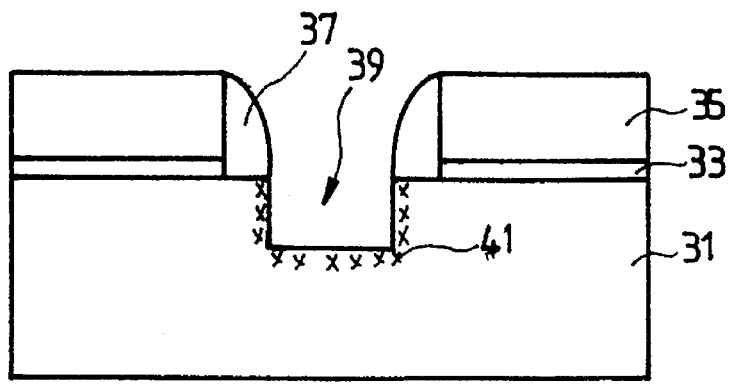
FIGS. 1A to 1C are schematic cross sectional views showing the processes of forming an element isolating insulating film of a semiconductor device, according to the present invention.

The application of the preferred embodiment of the invention is best understood with reference to the accompanying drawings, wherein like reference numerals are used for like and corresponding parts, respectively.

Referring to FIG. 1, there is illustrated a method for forming an element isolation insulating film of semiconductor devices, according to the present invention.

First, a pad oxide film 33 is formed on a semiconductor substrate 31 and then, covered with a first nitride film 35, as shown in FIG. 1A. Using a mask, the first nitride film 35 is patterned to expose an inactive region of the semiconductor substrate 31. At the side wall of the patterned first nitride film 35, a spacer 37 is constructed. For this spacer 37, a blanket of a second nitride film is formed over the patterned first nitride film 35, followed by anisotropic etch.

Thereafter, using the patterned first nitride film 35 and the second nitride film spacer 37 as a mask, the semiconductor substrate 31 is subjected to dry etch, to form a trench 39. At this time, lattice defects 41 occur at the surface of the trench 39, owing to the etching process.

Figure 1B:
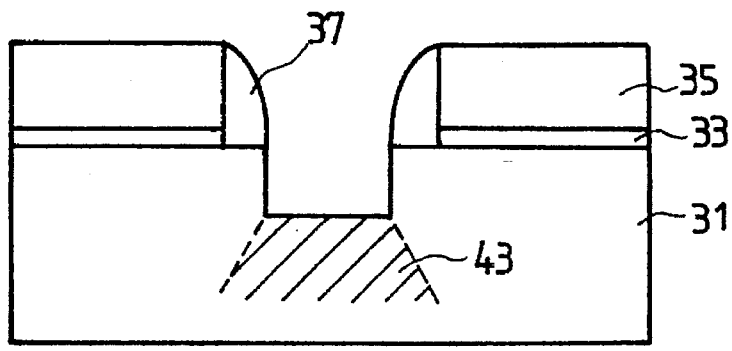

Subsequently, using the patterned first nitride film 35 and the second nitride film spacer 37 as a mask, germanium (Ge) ions are implanted in the semiconductor substrate 31 to form an amorphous region 43, followed by an SPE process to crystalize the amorphous region 43, as shown in FIG. 1B. It is preferred that the dose of the dopants are between a threshold amount to make the semiconductor substrate 31 amorphous, $9 \times 10^{13}/cm^2$, and $1 \times 10^{15}/cm^2$. Usually, the ions are accelerated at an energy of 10 to 100 KeV. As to the SPE process, a thermal treatment is carried out at a temperature of 500° to 600° C. for 1 to 3 hours.

Figure 1C:
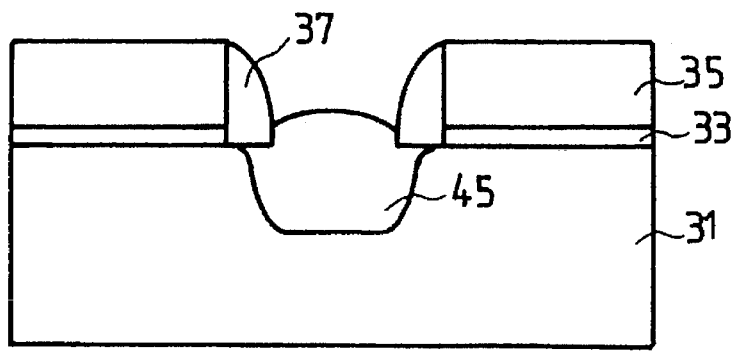

FIG. 1C is a cross section after an element isolation insulating film 45 is formed in the trench by a thermal oxidation process.

With reference to FIG. 2, there is shown the distribution of junction leakage currents according to a prior art and the present invention. This distribution is made in such a way that 130 test patterns formed on an 8 inch wafer are plotted in an increasing order of junction leakage currents in percentage. For example, 50 percent denotes the test pattern die whose junction leakage current is 65th in the plots. The junction leakage currents were measured at a temperature of 30° to 130° C. when applying a voltage of 6 V.

Figure 2A:
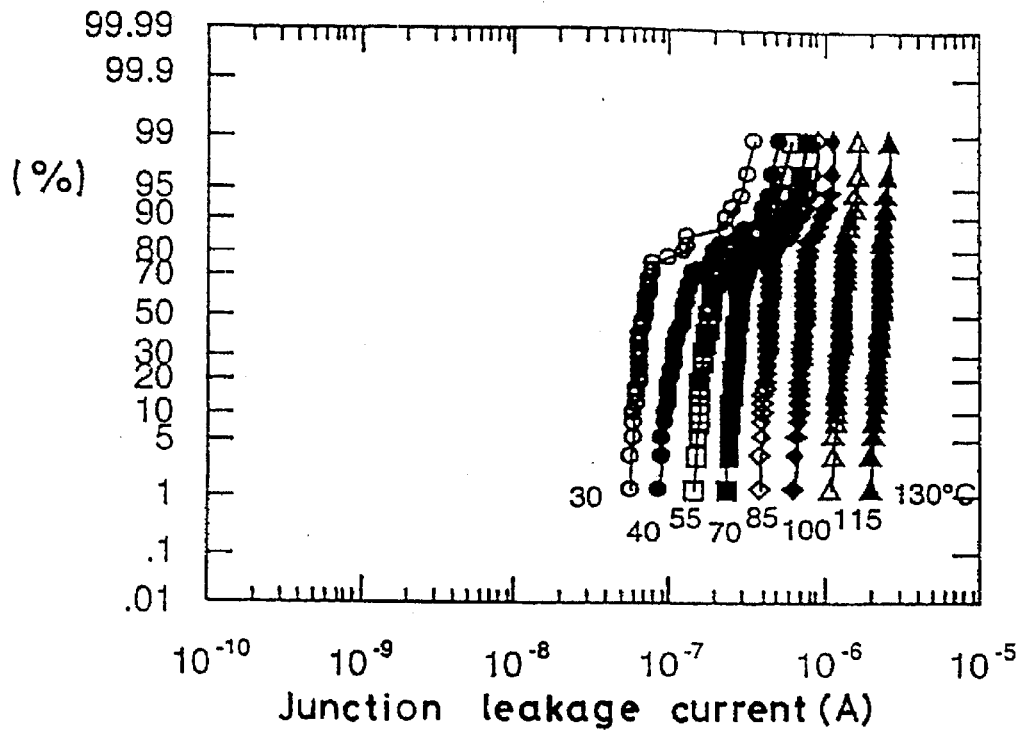
FIG. 2A is a graph showing the distribution of junction leakage currents, according to a prior art.

FIG. 2A shows the distribution of junction leakage current according to a prior art. As shown in this plot, the junction leakage current abruptly increases at 70% or higher, so that 20 to 30% of the 130 test patterns are damaged.

Figure 2B:
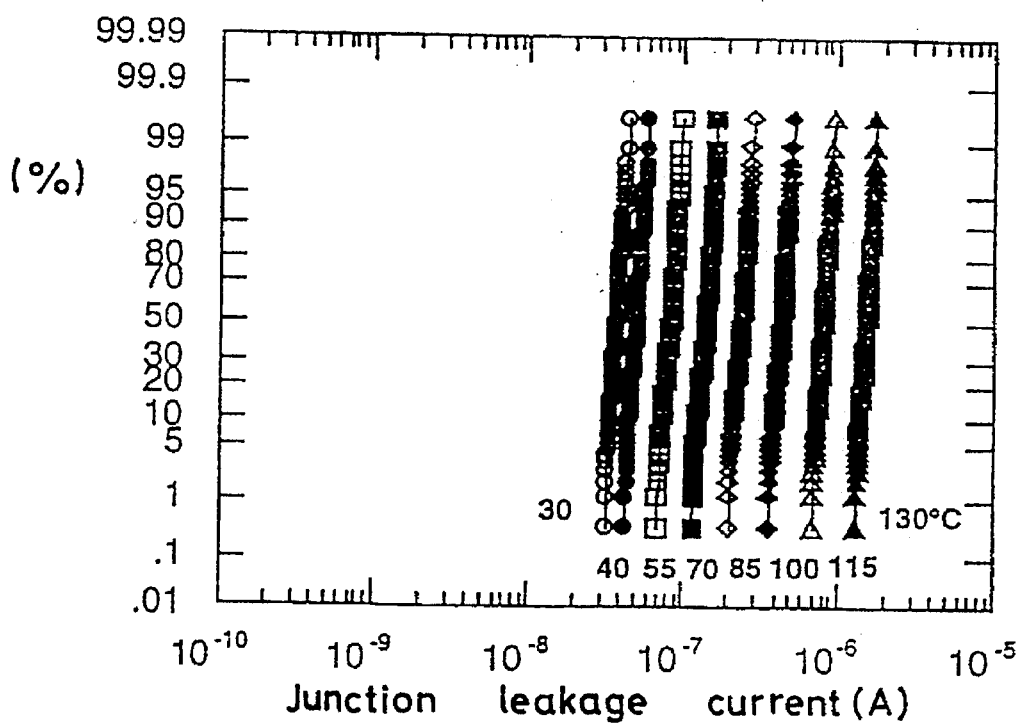
FIG. 2B is a graph showing the distribution of junction leakage currents, according to the present invention.

FIG. 2B shows the distribution of junction leakage current according to the present invention. In contrast with the prior art, the junction leakage current according to the present invention is uniformly maintained at low temperature regions as well as high temperature regions, resulting in no damaged test pattern. Hence, an improvement in yield of 20 to 30% is brought about, in contrast to the prior art.

As described hereinbefore, the method for forming an element isolation insulating film of semiconductor devices according to the present invention can solve the problems involving the process, encountered in the prior art, by constructing an isolation film free of lattice defects in a trench formed in a semiconductor substrate. In addition, the method of the present invention can greatly improve yield, reliability and productivity and leads the semiconductor device to high integration by reducing the junction leakage current occurring upon forming the trench.

The present invention has been described in an illustrative manner, and it is to be understood that the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A method for forming an element isolation insulating film of semiconductor devices, comprising the steps of:

forming a pad oxide film and a first insulating film on a semiconductor substrate, in sequence;

patterning the pad oxide film and the first insulating film to expose an inactive region of the semiconductor device;

constructing a spacer with a second insulating film at the side wall of the patterned first insulating film;

etching the semiconductor substrate at a certain depth, to form a trench, said patterned first insulating film and said second insulating film spacer serving as a mask;

implanting germanium impurities in the trench at a predetermined dose under a predetermined energy, to form an amorphous region to remove the lattice defects occurring upon forming the trench, said patterned first insulating film and said second insulating film spacer serving as a mask;

crystallizing the amorphous region by a solid phase epitaxy process; and constructing an element isolation insulating film in the trench by thermal oxidation.

2. A method in accordance with claim 1, wherein said first insulating film and said second insulating film are both made of nitride.

3. A method in accordance with claim 1, wherein said predetermined dose ranges from $9 \times 10^{13}/cm^2$ to $1.0 \times 10^{15}/cm^2$.

4. A method in accordance with claim 1, wherein said predetermined energy ranges from 10 to 100 KeV.

5. A method in accordance with claim 1, wherein said solid phase epitaxy process is carried out at a temperature of 500° to 600° C. for 1 to 3 hours under a nitrogen atmosphere.

* * * * *